(12) United States Patent
Huang et al.

(10) Patent No.: US 10,311,766 B2
(45) Date of Patent: Jun. 4, 2019

(54) TEST CIRCUIT FOR IN-CELL TOUCH SCREEN

(71) Applicant: WUHAN CHINA STAR OPTOELECTRONICS TECHNOLOGY CO., LTD., Wuhan, Hubei (CN)

(72) Inventors: Yao-Li Huang, Hubei (CN); Xinglong He, Hubei (CN)

(73) Assignee: WUHAN CHINA STAR OPTOELECTRONICS TECHNOLOGY CO., LTD., Wuhan (CN)

( * ) Notice: Subject to any disclaimer, the term of this patent is extended or adjusted under 35 U.S.C. 154(b) by 0 days.

(21) Appl. No.: 15/572,674

(22) PCT Filed: Aug. 8, 2017

(86) PCT No.: PCT/CN2017/096347
§ 371 (c)(1),
(2) Date: Nov. 8, 2017

(87) PCT Pub. No.: WO2019/000568
PCT Pub. Date: Jan. 3, 2019

(65) Prior Publication Data
US 2019/0005861 A1    Jan. 3, 2019

(51) Int. Cl.
*G06F 3/041* (2006.01)
*G09G 3/00* (2006.01)
*H01L 27/12* (2006.01)
*G02F 1/1362* (2006.01)
*G06F 3/047* (2006.01)
*G02F 1/1333* (2006.01)

(52) U.S. Cl.
CPC .......... *G09G 3/006* (2013.01); *G02F 1/13338* (2013.01); *G02F 1/136286* (2013.01); *G06F 3/047* (2013.01); *G06F 3/0412* (2013.01); *H01L 27/124* (2013.01); *G02F 2201/123* (2013.01)

(58) Field of Classification Search
CPC ....... G09G 3/006; G06F 3/0412; G06F 3/047; G02F 1/13338; G02F 1/136286; G02F 2201/123; H01L 27/124
USPC ........................................ 345/173; 178/18.01
See application file for complete search history.

(56) References Cited

U.S. PATENT DOCUMENTS

| | | | |
|---|---|---|---|
| 2016/0358525 A1* | 12/2016 | Huang | G09G 3/3655 |
| 2016/0364068 A1* | 12/2016 | Cheng | G06F 3/0416 |
| 2017/0205956 A1* | 7/2017 | Li | G02F 1/13338 |
| 2017/0228074 A1* | 8/2017 | Du | G02F 1/133514 |

* cited by examiner

*Primary Examiner* — Adam J Snyder
(74) *Attorney, Agent, or Firm* — Kirton McConkie; Evan R. Witt (57) ABSTRACT

A test circuit which is configured to test an in-cell touch screen includes a plurality of cascaded scanning circuits. The scanning circuit includes a test signal input terminal, a test signal output terminal connected to the touch electrode correspondingly through a first signal line and configured to input a test signal to the corresponding touch electrode, and a short-circuit feedback terminal connected to the touch electrode which the test signal output terminal of the scanning circuit at a previous stage is connected to.

10 Claims, 3 Drawing Sheets

TEST CIRCUIT FOR IN-CELL TOUCH SCREEN

BACKGROUND

1. Field of the Disclosure

The present disclosure relates to the field of liquid crystal display, and more particularly, to a test circuit for in-cell touch screen.

2. Description of the Related Art

Before a driving chip and a flexible printed circuit (FPC) are compressed to be an in-cell touch screen, a circuit channel short-circuit test for the touch screen is conducted to prevent the touch screen with a faulty circuit from being compressed to the driving chip and the FPC, thereby resulting in waste of materials.

Figure 1:
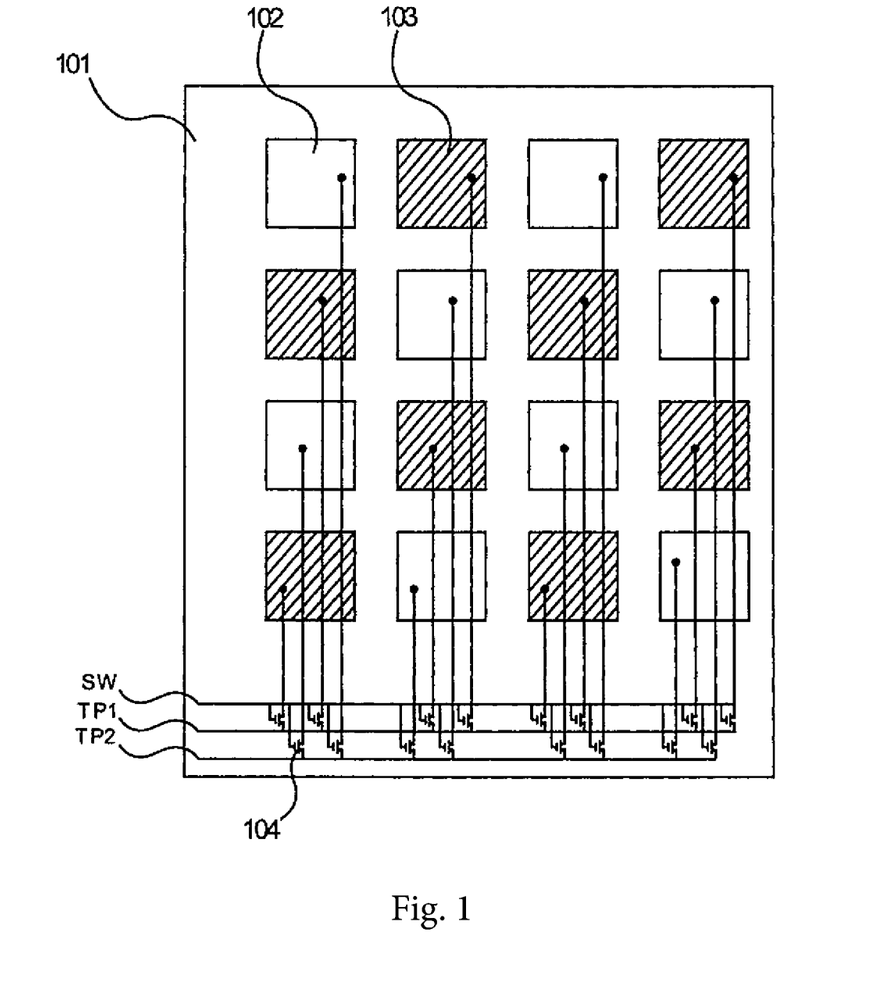
FIG. 1 illustrates a schematic diagram of a test circuit for an in-cell touch screen in the related art.

As FIG. 1 illustrates, the test circuit for an in-cell touch screen includes a touch array and a display array (not illustrated). The display array is arranged on an upper part of the touch array. The touch array is formed on the array substrate 101. The display array includes a plurality of scanning lines and a plurality of data lines. The plurality of scanning lines cross the plurality of data lines perpendicularly. The plurality of scanning lines and the plurality of data lines form a plurality of pixel units.

A conventional test for a touch screen having a panel with a touch array which includes a plurality of block-shaped touch electrodes. Each of the plurality of touch electrodes is connected to a thin-film transistor (TFT) 104 through a metallic line. To facilitate elaboration, each of the plurality of touch electrodes is divided into an odd-numbered touch electrode 102 and an even-numbered touch electrode 103. All of the odd-numbered touch electrodes 102 and all of the even-numbered touch electrodes 103 are arranged like a checkerboard. Each of the plurality of touch electrodes is connected to a drain of the corresponding TFT 104. A gate of the TFT 104 which each of the plurality of touch electrodes is correspondingly connected to is connected to a control signal line (SW). A source of the TFT 104 which each of the even-numbered touch electrodes 103 is correspondingly connected to is connected to a first test signal line (TP1). A source of the TFT 104 which each of the odd-numbered touch electrodes 102 is correspondingly connected to is connected to a second test signal line (TP2).

When the test conducted, the SW signal line is forced to be at high voltage level to turn on the TFT 104 controlled by the SW signal line. The TP1 signal line and the TP2 signal line are given different amounts of voltage. For example, the TP1 signal line is given the voltage of zero volts (0V); the TP2 signal line is given the voltage of ±5V. All of the data lines are given the voltage of 0V. Because the touch electrode of the touch array is a common electrode of the display array, the brightness of the display area which the even-numbered touch electrode 103 corresponds to may be different from the brightness of the display area which the odd-numbered touch electrode 102 corresponds to when the voltage imposed on the even-numbered touch electrode 103 is different from the voltage imposed on the odd-numbered touch electrode 102. The area which the odd-numbered touch electrode 102 corresponds to is brighter (because the voltage imposed on the TP2 signal line is greater) and the area which the even-numbered touch electrode 103 corresponds to is darker (because the voltage imposed on the TP1 signal line is smaller), which is normal for the display brightness. Accordingly, the difference of the display brightness can be detected whether to be normal to detect the touch electrode whether to be turned on normally.

However, in the touch circuit test method of the in-cell touch screen of the related art, when an even-numbered touch electrode 103 short-circuits another even-numbered touch electrode 103, the detection of the touch circuit fails. Likewise, when an odd-numbered touch electrode 102 short-circuits another odd-numbered touch electrode 102, the detection of the touch circuit fails. The failure of the detection may increase the probability of the touch defect existing in the touch screen.

SUMMARY

A test circuit for an in-cell touch screen is proposed by the present disclosure to detect the short-circuit defect among signal lines of a touch electrode to deal with a touch circuit test method of an test circuit for an in-cell touch screen of the related art. When two even-numbered touch electrodes or two odd-numbered touch electrodes are short-circuited, the detection of the touch circuit fails. Since the detection is not successful, the probability of the touch defect existing in the touch screen may increase.

According to a first aspect of the present invention, a test circuit configured to test an in-cell touch screen. The test circuit is connected to a touch electrode array that is connected to a display array. The test circuit comprises a plurality of cascaded scanning circuits. The scanning circuit at each stage is correspondingly connected to one of the touch electrodes. The scanning circuit includes: a test signal input terminal configured to receive a test signal source; a test signal output terminal, connected to the touch electrode correspondingly through a first signal line and configured to input a test signal to the corresponding touch electrode; and a short-circuit feedback terminal, connected to the touch electrode which the test signal output terminal of the scanning circuit at a previous stage is connected to. After the touch electrode which the test signal output terminal of the scanning circuit at the current stage is connected to short-circuits the touch electrode which the test signal output terminal of the scanning circuit at the previous stage is connected to, the first signal line, the second signal line, and the scanning circuit at the current stage forming a loop so as to lower a voltage imposed on the touch electrode which the test signal output terminal of the scanning circuit at the current stage, causing the brightness of the corresponding display area to be darker. The test signal output terminal of each of the scanning circuits, transmits a high-voltage-level signal to the corresponding touch electrode subsequently and circularly. When the touch electrode receives the high-voltage-level signal, the other touch electrodes receiving a low-voltage-level signal.

In one aspect of the present invention, the display array comprises a plurality of scanning lines and a plurality of data lines; the plurality of scanning lines cross the plurality of data lines perpendicularly; the plurality of scanning lines and the plurality of data lines form a plurality of pixel units; each of the plurality of pixel units comprises a pixel electrode and a thin-film transistor (TFT); the TFT comprises a gate, a source, and a drain; the gate of the TFT is connected to the corresponding scanning line; the drain of the TFT is connected to the corresponding pixel electrode; the source of the TFT is connected to the corresponding data line. When a touch electrode channel is tested, the data line transmits zero volts (0V) to the pixel unit.

In another aspect of the present invention, the test signal output terminal of the scanning circuit outputs the high-voltage-level signal or the low-voltage-level signal; a voltage difference between the high-voltage-level signal and the data line output signal is equal to an absolute value of the voltage difference between the low-voltage-level signal and the data line output signal.

According to a second aspect of the present invention, a test circuit configured to test an in-cell touch screen. The test circuit is connected to a touch electrode array that is connected to a display array. The test circuit comprises a plurality of cascaded scanning circuits. The scanning circuit at each stage is correspondingly connected to one of the touch electrodes. The scanning circuit includes: a test signal input terminal configured to receive a test signal source; a test signal output terminal, connected to the touch electrode correspondingly through a first signal line and configured to input a test signal to the corresponding touch electrode; and a short-circuit feedback terminal, connected to the touch electrode which the test signal output terminal of the scanning circuit at a previous stage is connected to. After the touch electrode which the test signal output terminal of the scanning circuit at the current stage is connected to short-circuits the touch electrode which the test signal output terminal of the scanning circuit at the previous stage is connected to, the first signal line, the second signal line, and the scanning circuit at the current stage forming a loop so as to lower a voltage imposed on the touch electrode which the test signal output terminal of the scanning circuit at the current stage, causing the brightness of the corresponding display area to be darker.

In one aspect of the present invention, the display array comprises a plurality of scanning lines and a plurality of data lines; the plurality of scanning lines cross the plurality of data lines perpendicularly; the plurality of scanning lines and the plurality of data lines form a plurality of pixel units; each of the plurality of pixel units comprises a pixel electrode and a thin-film transistor (TFT); the TFT comprises a gate, a source, and a drain; the gate of the TFT is connected to the corresponding scanning line; the drain of the TFT is connected to the corresponding pixel electrode; the source of the TFT is connected to the corresponding data line. When a touch electrode channel is tested, the data line transmits zero volts (0V) to the pixel unit.

In another aspect of the present invention, the test signal output terminal of the scanning circuit outputs the high-voltage-level signal or the low-voltage-level signal; a voltage difference between the high-voltage-level signal and the data line output signal is equal to an absolute value of the voltage difference between the low-voltage-level signal and the data line output signal.

According to a third aspect of the present invention, a test circuit configured to test an in-cell touch screen. The test circuit is connected to a touch electrode array that is connected to a display array. The test circuit comprises a plurality of cascaded scanning circuits. The scanning circuit at each stage is correspondingly connected to one of the touch electrodes. The scanning circuit includes: a test signal input terminal, configured to receive a test signal source; a test signal output terminal, connected to a first signal line; each of the touch electrodes in the same row being connected to the first signal line through a second signal line; the test signal output terminal being configured to input a test signal to the corresponding touch electrode. The touch electrode which the scanning circuit at the current stage is connected to being defined as a first touch electrode; the touch electrode which the scanning circuit at the previous stage is connected to being defined as a second touch electrode; when the first touch electrode short-circuits the second touch electrode, the second signal line which the first touch electrode is connected to, the second signal line which the second touch electrode is connected to, the scanning circuit at the previous stage, the scanning circuit at the current stage, and the first signal line which the scanning circuit at the current stage is connected to forming a loop so as to lower a voltage imposed on the first touch electrode, causing the brightness of a corresponding display area to be darker.

In one aspect of the present invention, the test signal output terminal of each of the scanning circuits, transmitting a high-voltage-level signal to the corresponding touch electrode subsequently and circularly; when the touch electrode receives the high-voltage-level signal, the other touch electrodes receiving a low-voltage-level signal.

In another aspect of the present invention, the display array comprises a plurality of scanning lines and a plurality of data lines; the plurality of scanning lines cross the plurality of data lines perpendicularly; the plurality of scanning lines and the plurality of data lines form a plurality of pixel units; each of the plurality of pixel units comprises a pixel electrode and a thin-film transistor (TFT); the TFT comprises a gate, a source, and a drain; the gate of the TFT is connected to the corresponding scanning line; the drain of the TFT is connected to the corresponding pixel electrode; the source of the TFT is connected to the corresponding data line. When a touch electrode channel is tested, the data line transmits zero volts (0V) to the pixel unit.

In yet another aspect of the present invention, the test signal output terminal of the scanning circuit outputs the high-voltage-level signal or the low-voltage-level signal; a voltage difference between the high-voltage-level signal and the data line output signal is equal to an absolute value of the voltage difference between the low-voltage-level signal and the data line output signal.

Compared with the test circuit for an in-cell touch screen of the related art, in the test circuit for an in-cell touch screen proposed by the present disclosure, after a touch electrode short-circuits another touch electrodes, the signal line which the short-circuited touch electrode is connected to, the signal line which the other short-circuited touch electrode is connected to, and the related scanning circuit form a loop to further lower the voltage imposed on the short-circuited touch electrode. As a result, the brightness of the display area which the short-circuited touch electrode corresponds to is darker than the brightness of the other areas, which is good for detecting the location of the short-circuited touch electrode and thereby improves the touch circuit test method of the in-cell touch screen of the related art. When an even-numbered touch electrode short-circuits another even-numbered touch electrode or an odd-numbered touch electrode short-circuits another odd-numbered touch electrode, the detection of the touch circuit fails. Since the detection is not successful, the probability of the touch defect existing in the touch screen may increase.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION OF THE EMBODIMENTS

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures.

The present disclosure proposes solutions to a touch circuit test method of an in-cell touch screen of the related art. When an even-numbered touch electrode short-circuits another even-numbered touch electrode or an odd-numbered touch electrode short-circuits another odd-numbered touch electrode, the detection of the touch circuit fails. The failure of the detection may increase the probability of the touch defect existing in the touch screen. The solutions of the present disclosure are introduced in the following embodiments of the present disclosure.

Embodiment 1

Figure 2:
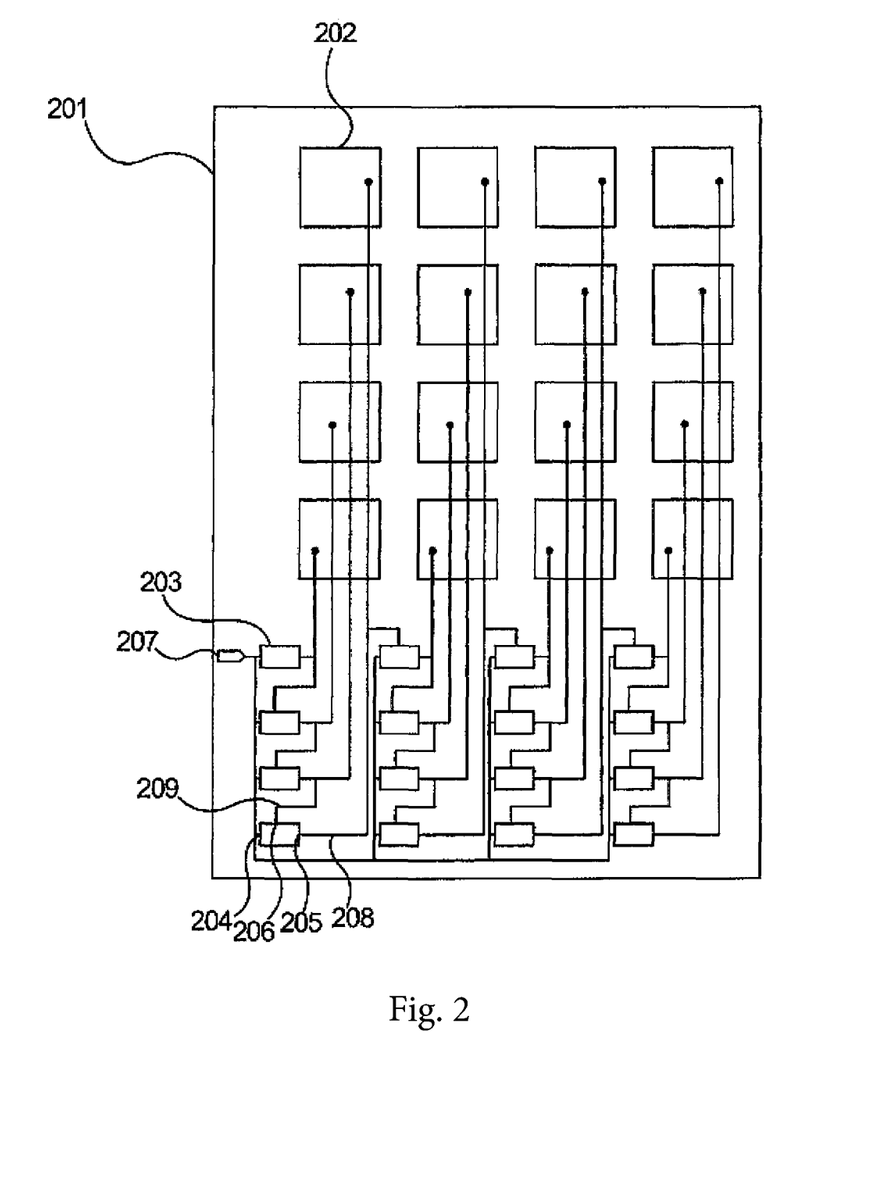
FIG. 2 illustrates a schematic diagram of a test circuit for an in-cell touch screen according to a first embodiment of the present disclosure.

As FIG. 2 illustrates, a test circuit for an in-cell touch screen is proposed by the present disclosure. The test circuit for an in-cell touch screen is connected to a touch electrode array. The touch electrode array is connected to a display array (not illustrated). The display array and the touch electrode are arranged in layers.

The touch electrode array is fabricated on an array substrate 201. The touch electrode array includes a plurality of touch electrodes 202. A gap is formed between any two of the adjacent touch electrodes 202 to make each of the plurality of touch electrodes 202 insulated with one another.

The display array comprises a plurality of scanning lines and a plurality of data lines. The plurality of scanning lines cross the plurality of data lines perpendicularly. The plurality of scanning lines and the plurality of data lines form a plurality of pixel units. Each of the plurality of pixel units comprises a pixel electrode and a thin-film transistor (TFT). The TFT comprises a gate, a source, and a drain. The gate of the TFT is connected to the corresponding scanning line, the drain of the TFT is connected to the corresponding pixel electrode, and the source of the TFT is connected to the corresponding data line.

A touch electrode 202 corresponds to a part of a pixel unit. The touch electrode 202 is configured to be a common electrode of the display array in addition to being a driving electrode of a touch screen which is combined with a sensing electrode to obtain information concerning a touch location. The touch electrode 202 supplies a constant current and then voltage difference between the touch electrode 202 and a pixel electrode to drive liquid crystal molecules to deflect to further diversify the transparency of the pixel unit.

The test circuit includes a plurality of scanning circuits 203 and the plurality of scanning circuits 203 are cascaded. The scanning circuit 203 at each stage is correspondingly connected to a touch electrode 202.

The scanning circuit 203 includes a test signal input terminal 204, a test signal output terminal 205, and a short-circuit feedback terminal 206.

The test signal input terminal 204 is configured to receive a test signal source 207 so as to provide a test signal to the scanning circuit 203 at each stage.

The test signal output terminal 205 is connected to a first signal line 208. Another terminal of the first signal line 208 is correspondingly connected to a touch electrode 202 so as to input the test signal to the touch electrode 202 correspondingly.

The short-circuit feedback terminal 206 is connected to a second signal line 209. Another terminal of the second signal line 209 is connected to a touch electrode 202 which the test signal output terminal 205 of the scanning circuit 203 at the previous stage is connected to.

After the touch electrode 202 which the test signal output terminal 205 of the scanning circuit 203 at the current stage is connected to short-circuits the touch electrode 202 which the test signal output terminal 205 of the scanning circuit 203 at the previous stage is connected to, the first signal line 208, the second signal line 209, and the scanning circuit 203 at the current stage form a loop. According to Ohm's Law, the current of the short-circuited touch electrode 202 which the scanning circuit 203 at the current stage is connected to flows to the short-circuited touch electrode 202. The certain electrical impedance existing in the signal line consumes some of the voltage so as to lower the absolute value of the voltage of the short-circuited touch electrode 202. The voltage difference between the voltage imposed on the touch electrode 202 and the voltage imposed on the pixel electrode reduces accordingly so as to reduce the brightness of the pixel unit which the short-circuited touch electrode 202 corresponds to and highlight the short-circuited touch electrode 202 successfully.

In a testing operation, the test signal source 207 inputs the test signal to the scanning circuit 203 at each stage so that the high voltage level is 5V and the low voltage level is −5V. Moreover, the pixel electrode of the display array receives voltage of 0V.

For example, the touch electrode 202 which the test signal output terminal 205 of the scanning circuit 203 at the current stage is connected to receives voltage of 5V, and the touch electrode 202 which the test signal output terminal 205 of the scanning circuit 203 at the other stages is connected to receives voltage of −5V. The voltage difference between the voltage imposed on the touch electrode 202 which the test signal output terminal 205 of the scanning circuit 203 at the current stage is connected to and the voltage imposed on the pixel electrode is 5V. The corresponding display area shows white brightness, and the voltage difference between the voltage imposed on the touch electrode 202 which the test signal output terminal 205 of the scanning circuit 203 at the other stages is connected to and the voltage imposed on the pixel electrode is −5V. The deflection angle of the liquid crystal molecules corresponding to the touch electrode 202 where a high voltage signal is input is symmetrical to the deflection angle of the liquid crystal molecules corresponding to the touch electrode 202 where a low voltage signal is input. When the circuit of the touch electrode 202 is normal, the display area which the touch electrode 202 at each stage corresponds to shows white brightness.

After the touch electrode 202 which the test signal output terminal 205 of the scanning circuit 203 at the current stage is connected to short-circuits the touch electrode 202 which the test signal output terminal 205 of the scanning circuit 203 at the previous stage is connected to, 5V of the short-circuited touch electrode 202 which the scanning circuit 203 at the current stage is connected to is induced. The current flowing to the voltage of −5V of the short-circuited touch electrode 202 which the scanning circuit 203 at the previous stage is connected to makes the absolute value of the voltage of the short-circuited touch electrode 202 lower than 5V. The voltage difference between the above-mentioned voltage and the voltage applied on the pixel electrode is lower than 5V. The brightness of the corresponding display area is less than the brightness of the other display areas, thereby easily detecting the short-circuited touch electrode 202.

Once any one of the touch electrodes 202 has a broken circuit, the test signal will fail to enter the corresponding touch electrodes 202. Accordingly, no voltage is imposed on the short-circuited touch electrodes 202, which makes the touch electrodes 202 show dark. In this way, the short-circuited touch electrodes 202 can be detected easily.

The test signal output terminal 205 of each of the scanning circuits 203 transmits the high-voltage-level signal to the corresponding touch electrode 202 subsequently and circularly. The scanning circuit 203 at the first stage to at the last stage undergoes scanning again, thereby enhancing the accuracy of detection.

Embodiment 2

Figure 3:
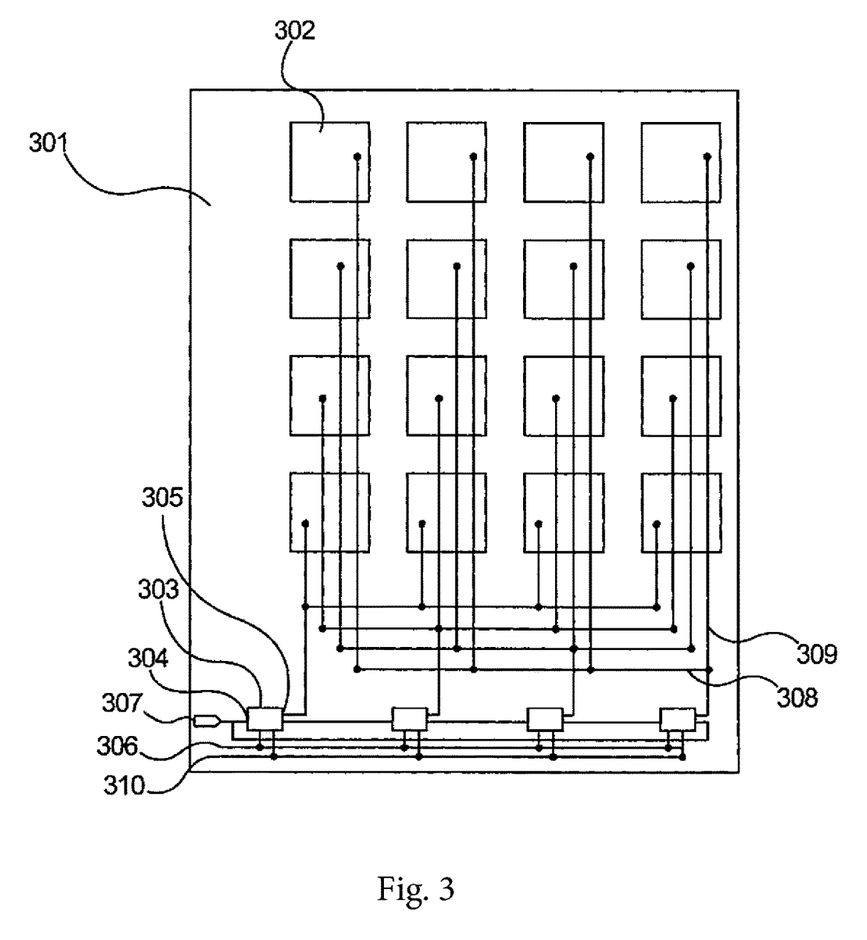
FIG. 3 illustrates a schematic diagram of a test circuit for an in-cell touch screen according to a second embodiment of the present disclosure.

As FIG. 3 illustrates, the present disclosure further proposes a test circuit for an in-cell touch screen. The test circuit for an in-cell touch screen is connected to a touch electrode array. The touch electrode array is formed on an array substrate 301. The touch electrode array includes a plurality of touch electrodes 302. The touch electrode 302 is connected to a display array (not illustrated). The display array and the touch electrode 302 are arranged in layers.

The test circuit includes a plurality of scanning circuits 303, and the plurality of scanning circuits 303 are cascaded. The scanning circuit 303 at each stage is correspondingly connected to a row of touch electrodes 302.

The scanning circuit 303 includes a test signal input terminal 304 and a test signal output terminal 305.

The test signal input terminal 304 is configured to receive a test signal source 307 so as to provide a test signal to the scanning circuit 303 at each stage.

The test signal output terminal 305 is connected to a first signal line 308. Each of the touch electrodes 302 in the same row is connected to the first signal line 308 through a second signal line 309. The test signal output terminal 305 is configured to input the test signal to the corresponding touch electrode 302.

The scanning circuit 303 at each stage is connected to a first clock signal routing 306 and a second clock signal routing 310 to control an order of scanning the scanning circuit 303 at each stage.

A touch electrode 302 which the scanning circuit 303 at the current stage is connected to is defined as a first touch electrode 302. A touch electrode 302 which the scanning circuit 303 at the previous stage is connected to is defined as a second touch electrode 302. When the first touch electrode 302 short-circuits the second touch electrode 302, the second signal line 309 which the first touch electrode 302 is connected to, the second signal line 309 which the second touch electrode 302 is connected to, the scanning circuit 303 at the previous stage, the scanning circuit 303 at the current stage, and the first signal line 308 which the scanning circuit 303 at the current stage is connected to form a loop so as to lower the voltage imposed on the first touch electrode 302, causing the brightness of the corresponding display area to be less than the brightness of the other display areas, thereby easily highlighting the short-circuited touch electrode 302.

The difference between the second embodiment and the first embodiment is that a scanning circuit corresponds to a row of touch electrodes in the second embodiment. Such a design is beneficial for reducing the quantity of the scanning circuit and downsizing the space surrounding the array substrate, which facilitates the realization of a narrow bezel.

The working principle of the test circuit for an in-cell touch screen proposed in the second embodiment is consistent with the working principle of the test circuit for an in-cell touch screen proposed in the first embodiment, so the detail of the working principle of the former can refer to the latter, that is the working principle of the test circuit for an in-cell touch screen proposed in the first embodiment.

Compared with the test circuit for an in-cell touch screen of the related art, in the test circuit for an in-cell touch screen proposed by the present disclosure, after a touch electrode short-circuits another touch electrodes, the signal line which the short-circuited touch electrode is connected to, the signal line which the other short-circuited touch electrode is connected to, and the related scanning circuit form a loop to further lower the voltage imposed on the short-circuited touch electrode. As a result, the brightness of the display area which the short-circuited touch electrode corresponds to is darker than the brightness of the other areas, which is good for detecting the location of the short-circuited touch electrode and thereby improves the touch circuit test method of the in-cell touch screen of the related art. When an even-numbered touch electrode short-circuits another even-numbered touch electrode or an odd-numbered touch electrode short-circuits another odd-numbered touch electrode, the detection of the touch circuit fails. Since the detection is not successful, the probability of the touch defect existing in the touch screen may increase.

While the present invention has been described in connection with what is considered the most practical and preferred embodiments, it is understood that this invention is not limited to the disclosed embodiments but is intended to cover various arrangements made without departing from the scope of the broadest interpretation of the appended claims.

What is claimed is:

1. A test circuit configured to test an in-cell touch screen, the test circuit connected to a touch electrode array that is connected to a display array;
the test circuit comprising: a plurality of cascaded scanning circuits; the scanning circuit at each stage correspondingly connected to one of the touch electrodes;
the scanning circuit comprising:
a test signal input terminal, configured to receive a test signal source;
a test signal output terminal, connected to the touch electrode correspondingly through a first signal line and configured to input a test signal to the corresponding touch electrode; and
a short-circuit feedback terminal, connected to the touch electrode which the test signal output terminal of the scanning circuit at a previous stage is connected to;
after the touch electrode which the test signal output terminal of the scanning circuit at the current stage is connected to short-circuits the touch electrode which the test signal output terminal of the scanning circuit at the previous stage is connected to, the first signal line, the second signal line, and the scanning circuit at the current stage forming a loop so as to lower a voltage imposed on the touch electrode which the test signal output terminal of the scanning circuit at the current stage, causing the brightness of the corresponding display area to be darker;

the test signal output terminal of each of the scanning circuits, transmitting a high-voltage-level signal to the corresponding touch electrode subsequently and circularly; when the touch electrode receives the high-voltage-level signal, the other touch electrodes receiving a low-voltage-level signal.

2. The test circuit of claim 1, wherein the display array comprises a plurality of scanning lines and a plurality of data lines; the plurality of scanning lines cross the plurality of data lines perpendicularly; the plurality of scanning lines and the plurality of data lines form a plurality of pixel units; each of the plurality of pixel units comprises a pixel electrode and a thin-film transistor (TFT); the TFT comprises a gate, a source, and a drain; the gate of the TFT is connected to the corresponding scanning line; the drain of the TFT is connected to the corresponding pixel electrode; the source of the TFT is connected to the corresponding data line; and when a touch electrode channel is tested, the data line transmits zero volts (0V) to the pixel unit.

3. The test circuit of claim 2, wherein the test signal output terminal of the scanning circuit outputs the high-voltage-level signal or the low-voltage-level signal; a voltage difference between the high-voltage-level signal and the data line output signal is equal to an absolute value of the voltage difference between the low-voltage-level signal and the data line output signal.

4. A test circuit configured to test an in-cell touch screen, the test circuit connected to a touch electrode array that is connected to a display array;

the test circuit comprising: a plurality of cascaded scanning circuits; the scanning circuit at each stage correspondingly connected to one of the touch electrodes;

the scanning circuit comprising:

a test signal input terminal, configured to receive a test signal source;

a test signal output terminal, connected to the touch electrode correspondingly through a first signal line and configured to input a test signal to the corresponding touch electrode; and a short-circuit feedback terminal, connected to the touch electrode which the test signal output terminal of the scanning circuit at a previous stage is connected to;

after the touch electrode which the test signal output terminal of the scanning circuit at the current stage is connected to short-circuits the touch electrode which the test signal output terminal of the scanning circuit at the previous stage is connected to, the first signal line, the second signal line, and the scanning circuit at the current stage forming a loop so as to lower a voltage imposed on the touch electrode which the test signal output terminal of the scanning circuit at the current stage, causing the brightness of the corresponding display area to be darker.

5. The test circuit of claim 4, wherein the display array comprises a plurality of scanning lines and a plurality of data lines; the plurality of scanning lines cross the plurality of data lines perpendicularly; the plurality of scanning lines and the plurality of data lines form a plurality of pixel units; each of the plurality of pixel units comprises a pixel electrode and a thin-film transistor (TFT); the TFT comprises a gate, a source, and a drain; the gate of the TFT is connected to the corresponding scanning line; the drain of the TFT is connected to the corresponding pixel electrode; the source of the TFT is connected to the corresponding data line; and when a touch electrode channel is tested, the data line transmits zero volts (0V) to the pixel unit.

6. The test circuit of claim 5, wherein the test signal output terminal of the scanning circuit outputs the high-voltage-level signal or the low-voltage-level signal; a voltage difference between the high-voltage-level signal and the data line output signal is equal to an absolute value of the voltage difference between the low-voltage-level signal and the data line output signal.

7. A test circuit configured to test an in-cell touch screen, the test circuit connected to a touch electrode array that is connected to a display array;

the test circuit comprising: a plurality of cascaded scanning circuits; the scanning circuit at each stage correspondingly connected to a row of touch electrodes;

the scanning circuit comprising:

a test signal input terminal, configured to receive a test signal source;

a test signal output terminal, connected to a first signal line; each of the touch electrodes in the same row being connected to the first signal line through a second signal line; the test signal output terminal being configured to input a test signal to the corresponding touch electrode;

the touch electrode which the scanning circuit at the current stage is connected to being defined as a first touch electrode; the touch electrode which the scanning circuit at the previous stage is connected to being defined as a second touch electrode; when the first touch electrode short-circuits the second touch electrode, the second signal line which the first touch electrode is connected to, the second signal line which the second touch electrode is connected to, the scanning circuit at the previous stage, the scanning circuit at the current stage, and the first signal line which the scanning circuit at the current stage is connected to forming a loop so as to lower a voltage imposed on the first touch electrode, causing the brightness of a corresponding display area to be darker.

8. The test circuit of claim 7, wherein the test signal output terminal of each of the scanning circuits, transmitting a high-voltage-level signal to the corresponding touch electrode subsequently and circularly; when the touch electrode receives the high-voltage-level signal, the other touch electrodes receiving a low-voltage-level signal.

9. The test circuit of claim 8, wherein the display array comprises a plurality of scanning lines and a plurality of data lines; the plurality of scanning lines cross the plurality of data lines perpendicularly; the plurality of scanning lines and the plurality of data lines form a plurality of pixel units; each of the plurality of pixel units comprises a pixel electrode and a thin-film transistor (TFT); the TFT comprises a gate, a source, and a drain; the gate of the TFT is connected to the corresponding scanning line; the drain of the TFT is connected to the corresponding pixel electrode; the source of the TFT is connected to the corresponding data line; and when a touch electrode channel is tested, the data line transmits zero volts (0V) to the pixel unit.

10. The test circuit of claim 9, wherein the test signal output terminal of the scanning circuit outputs the high-voltage-level signal or the low-voltage-level signal; a voltage difference between the high-voltage-level signal and the data line output signal is equal to an absolute value of the voltage difference between the low-voltage-level signal and the data line output signal.

\* \* \* \* \*

UNITED STATES PATENT AND TRADEMARK OFFICE
CERTIFICATE OF CORRECTION

PATENT NO. : 10,311,766 B2
APPLICATION NO. : 15/572674
DATED : June 4, 2019
INVENTOR(S) : Yao-Li Huang et al.

Page 1 of 1

It is certified that error appears in the above-identified patent and that said Letters Patent is hereby corrected as shown below:

On the Title Page

Please insert the foreign application priority data as follows:
--(30) Foreign Application Priority Data
Jun. 30, 2017 (CN) ................... 201710524276.3--

Signed and Sealed this
Seventeenth Day of September, 2019

Andrei Iancu
*Director of the United States Patent and Trademark Office*